United States Patent [19]

Furuyama et al.

[11] Patent Number: 5,479,370
[45] Date of Patent: Dec. 26, 1995

[54] SEMICONDUCTOR MEMORY WITH BYPASS CIRCUIT

[75] Inventors: Tohru Furuyama, Tokyo; Donald C. Stark, Zushi, both of Japan

[73] Assignee: Kabushiki Kaisha Toshiba, Kawasaki, Japan

[21] Appl. No.: 376,439

[22] Filed: Jan. 23, 1995

Related U.S. Application Data

[63] Continuation of Ser. No. 19,319, Feb. 18, 1993, abandoned.

[30] Foreign Application Priority Data

Feb. 20, 1992 [JP] Japan ...................................... 4-033395

[51] Int. Cl.$^6$ .......................... G11C 13/00; G11C 11/34
[52] U.S. Cl. ................. 365/189.12; 365/200; 365/225.7; 365/149; 365/230.05
[58] Field of Search ............................... 365/189.12, 200, 365/225.7, 149, 230.06, 230.05; 371/10.1, 10.2, 10.3

[56] References Cited

U.S. PATENT DOCUMENTS

| | | | |
|---|---|---|---|
| 4,903,242 | 2/1990 | Hamaguchi et al. | 365/189.12 |
| 4,954,994 | 9/1990 | Hashimoto | 365/221 |
| 5,005,158 | 4/1991 | McClure et al. | 365/200 |
| 5,018,110 | 5/1991 | Sugiyama et al. | 365/221 |
| 5,255,226 | 10/1993 | Ohno et al. | 365/189.12 |

*Primary Examiner*—David C. Nelms
*Assistant Examiner*—Huan Hoang
*Attorney, Agent, or Firm*—Banner & Allegretti, Ltd.

[57] ABSTRACT

A semiconductor memory of this invention comprises a memory cell array containing memory cells arranged in matrix form, word lines each connected to all the memory cells in the same row, and bit lines each connected to all the memory cells in the same column, a shift register containing a plurality of stages of shift circuits which is used as a serial address pointer for serially specifying the addresses of actually used rows and/or columns in the memory cell array, a bypass circuit capable of forming a bypass for the shift circuit at a given stage of the shift register, and a bypass control circuit for determining whether or not a bypass is to be formed by the bypass circuit.

27 Claims, 12 Drawing Sheets

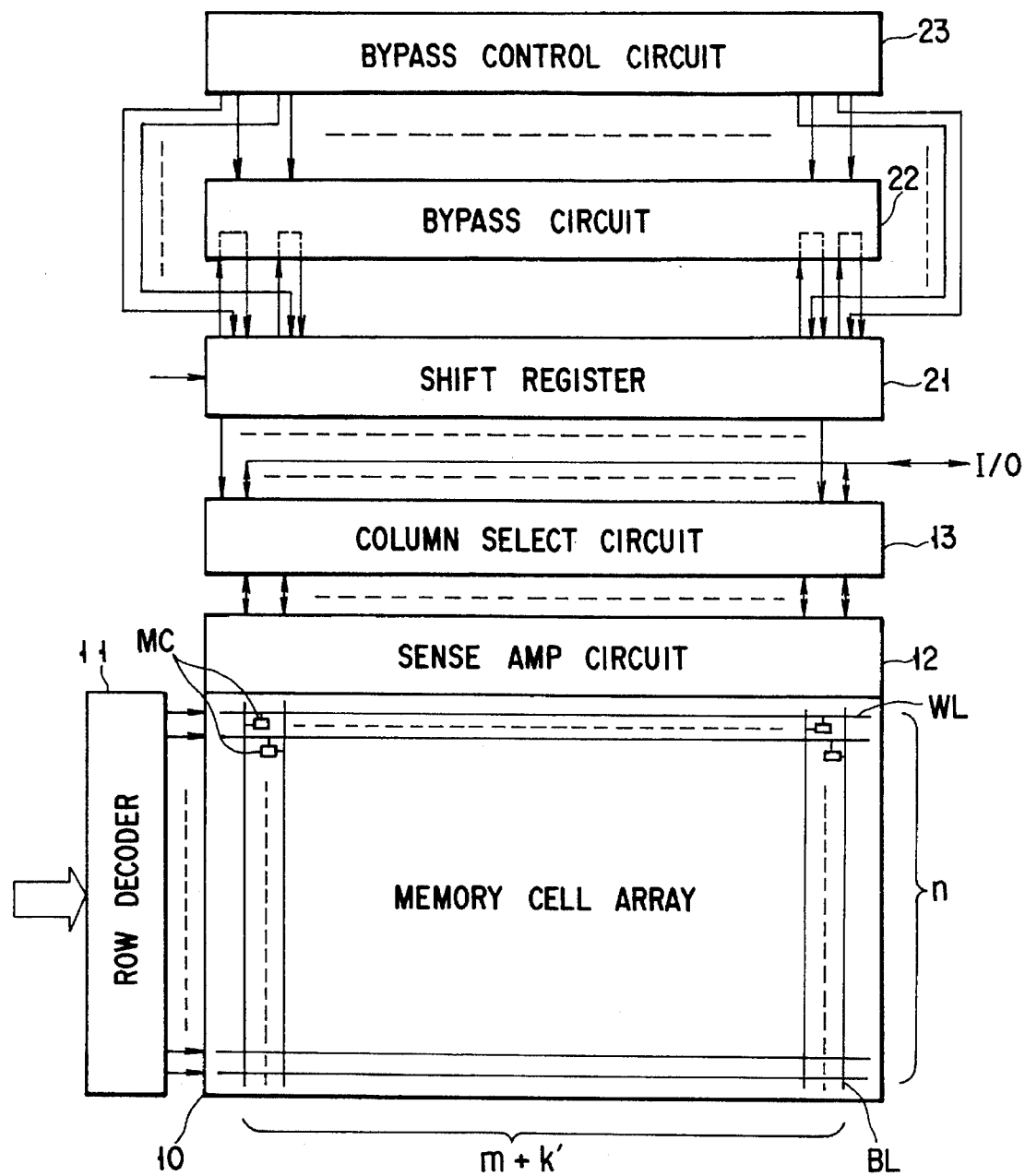
F I G. 1

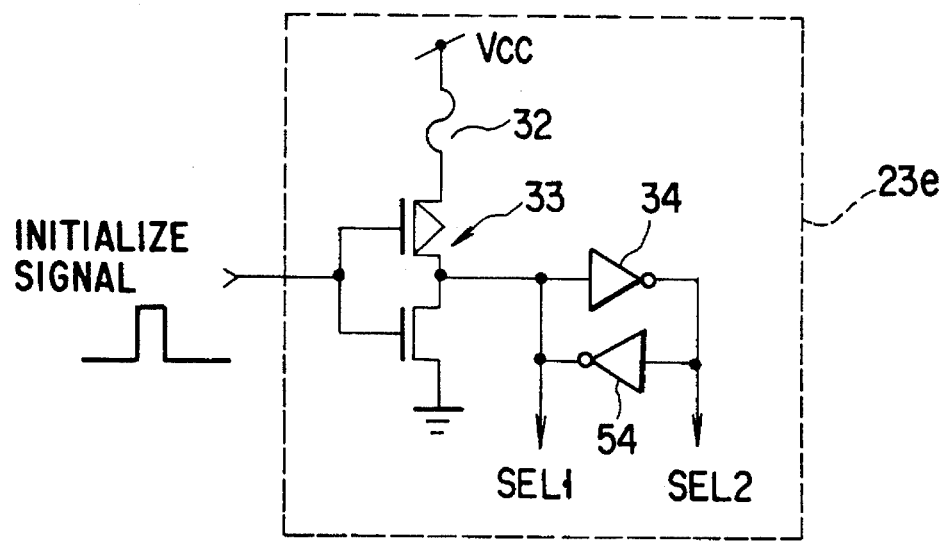
F I G. 8
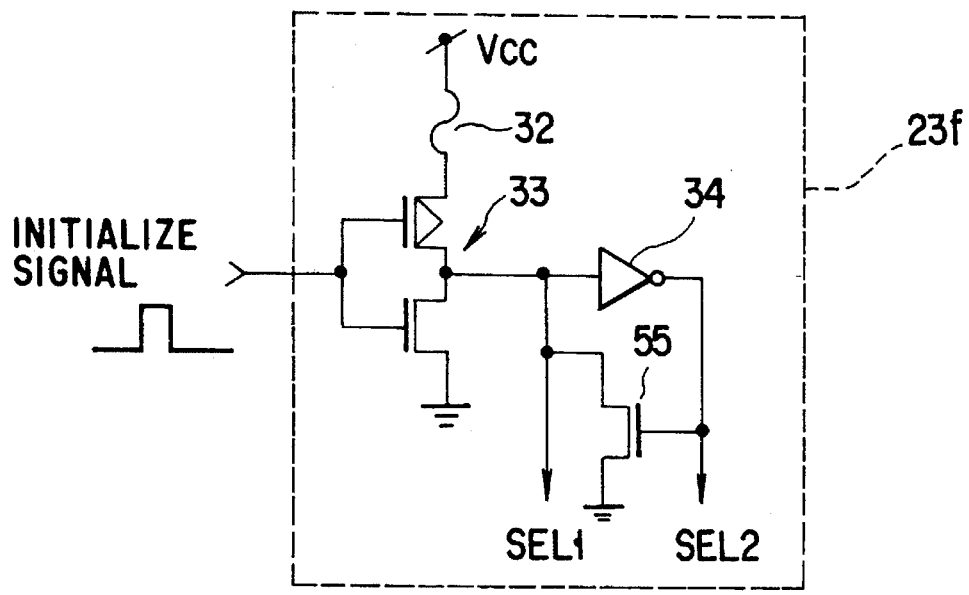
F I G. 9

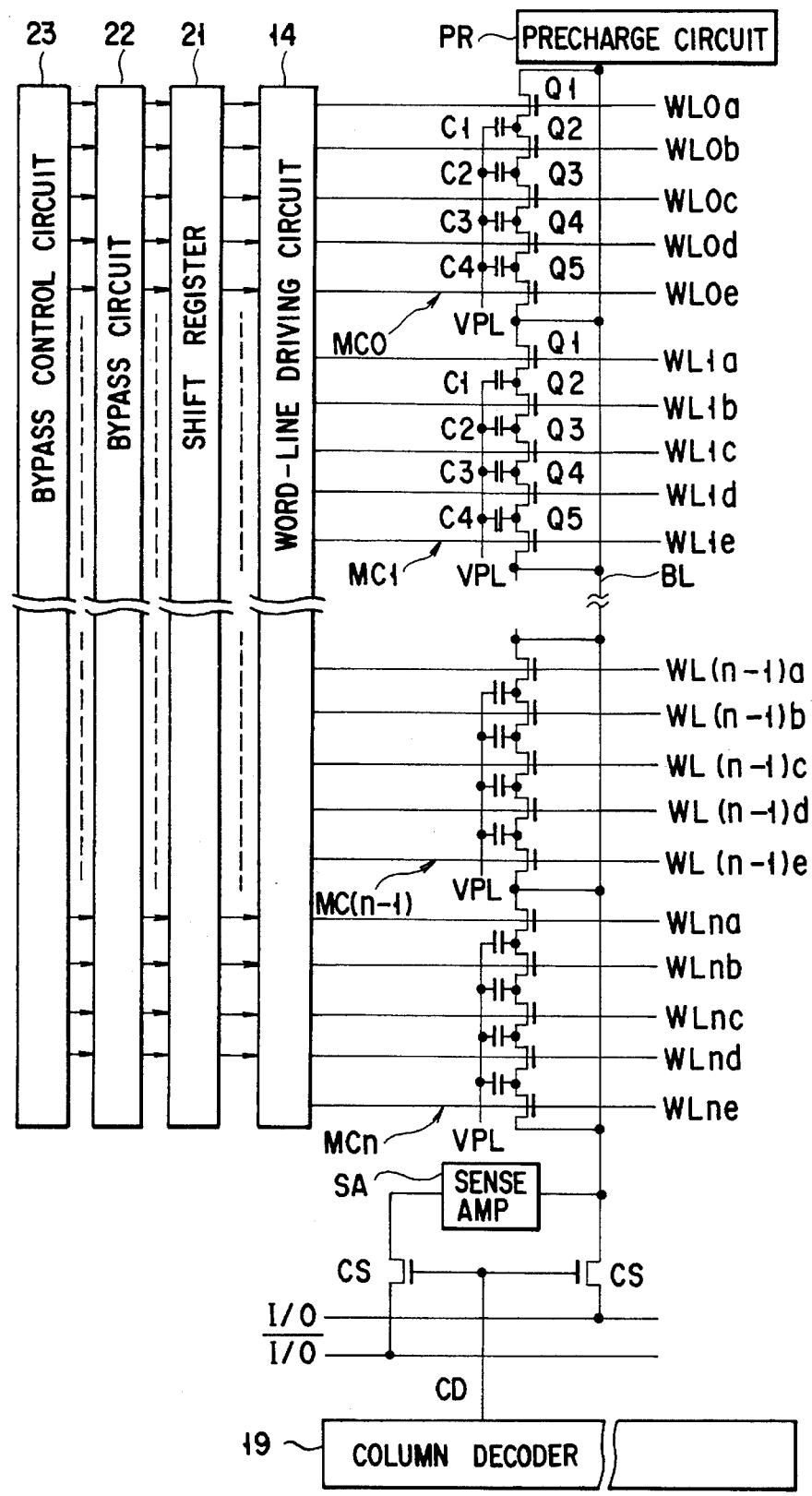
F I G. 11

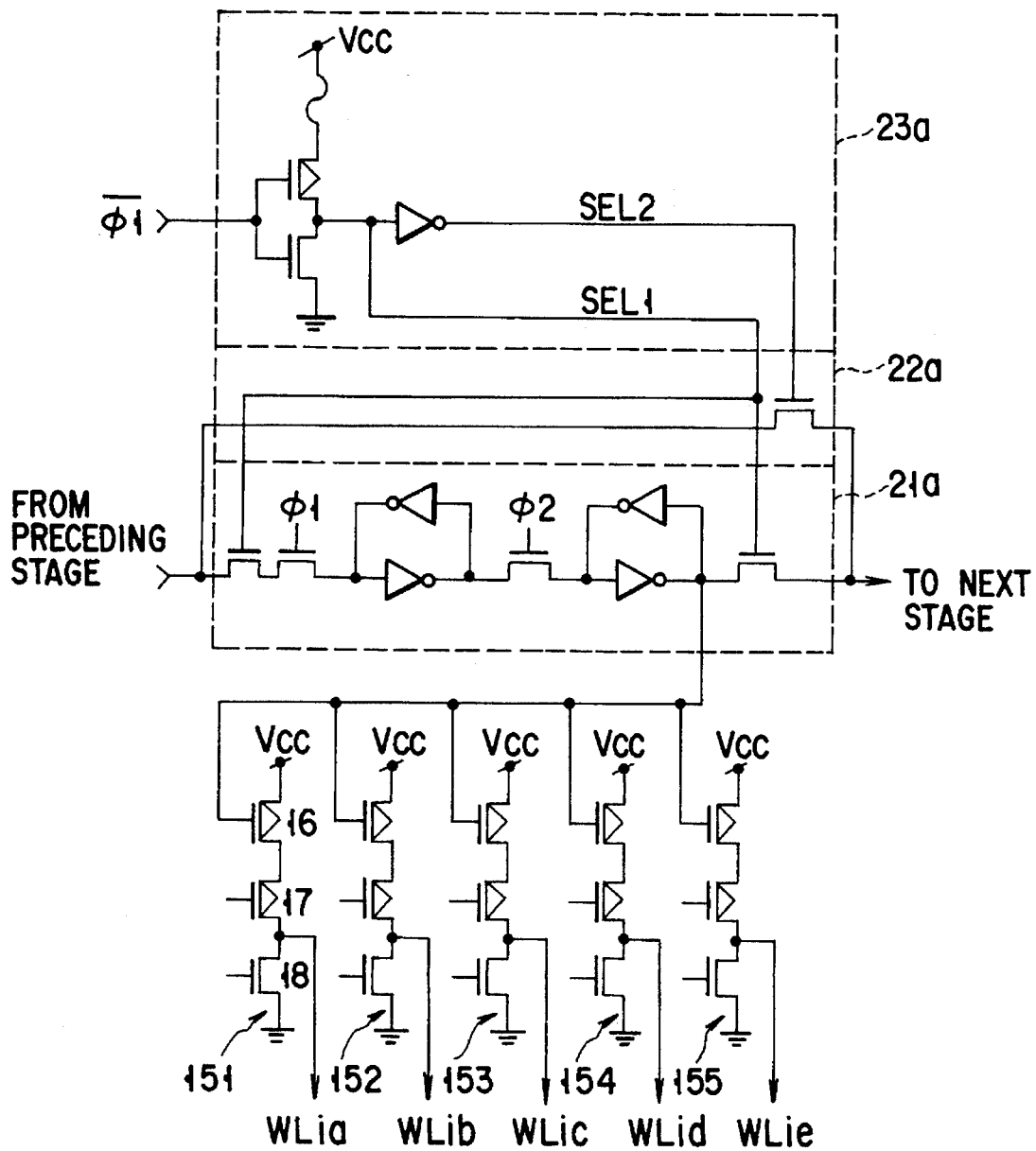
F I G. 15

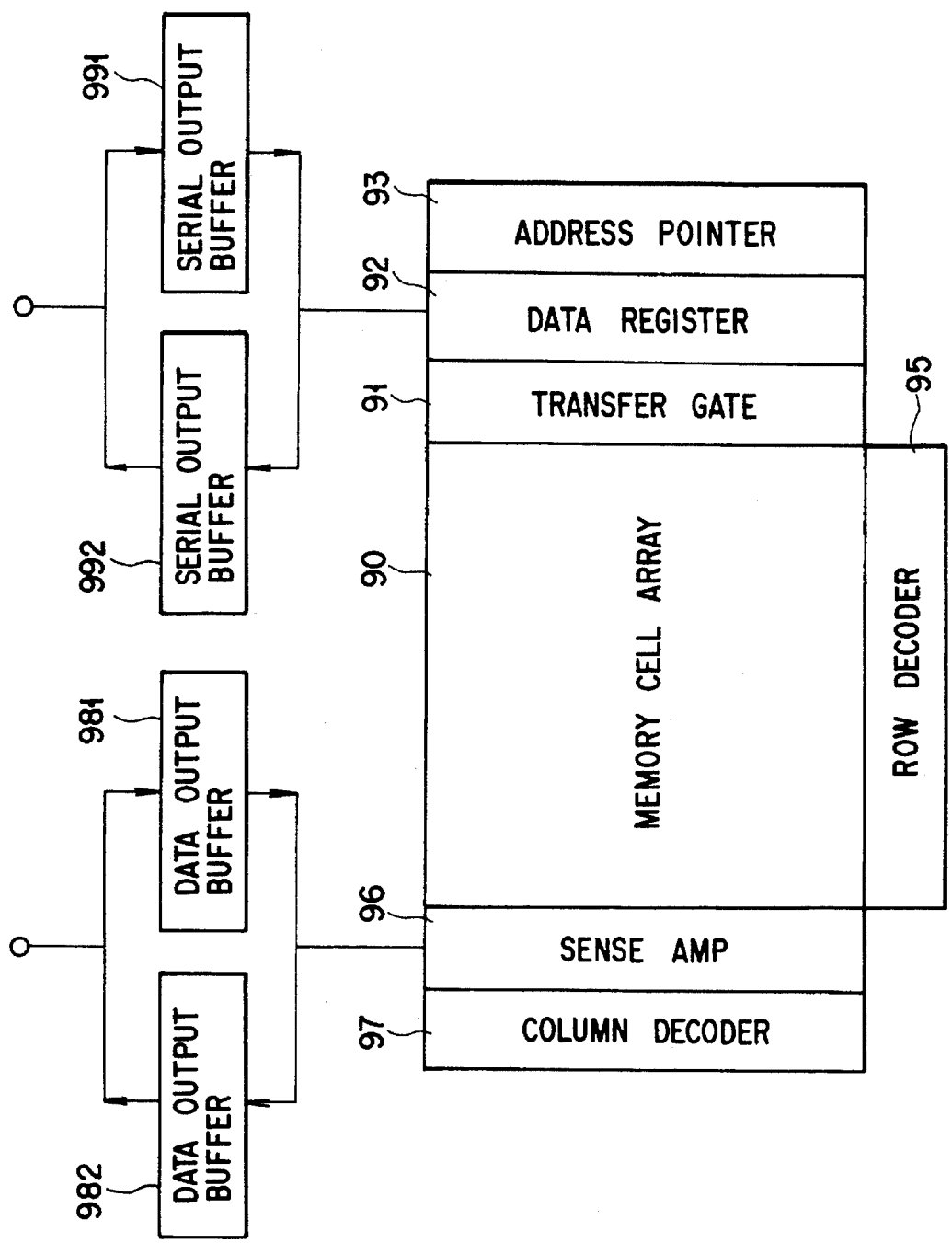
F I G. 17

5,479,370

SEMICONDUCTOR MEMORY WITH BYPASS CIRCUIT

This application is a continuation of application Ser. No. 08/019,319, filed Feb. 18, 1993, now abandoned.

BACKGROUND OF THE INVENTION

1. Field of the Invention

This invention relates to a semiconductor memory, and more particularly to a semiconductor memory using a serial address pointer such as a sequential-access or serial-access memory, a VRAM (video RAM), or a field memory.

2. Description of the Related Art

Conventional sequential-access memories use a serial address pointer for specifying an address in a memory array to be accessed sequentially.

The address pointer, which is placed to one side of a memory cell array, is normally composed of a shift register containing fixed n stages of D flip-flop circuits series-connected, or of a log $2^n$-stage binary counter section and a decoder section with a fixed number of stages for decoding the output signal from each stage of the binary counter section.

In conventional sequential-access memories using a serial address pointer as mentioned above, there has been no redundancy in the memory cell array.

If redundancy techniques were introduced to the sequential-access memories like ordinary RAMs, semiconductor memories with a certain memory capacity would be realized by providing spare rows and/or columns in a particular location in the memory cell array and replacing the defective row and/or column, if any, with a spare row and/or column to remedy the faulty chip.

In this case, if the number of defective rows and/or columns were larger than that of spare rows and/or columns, or if spare rows and/or columns themselves were defective, it would be impossible to remedy the faulty chip, resulting in a poorer yield. Further, the remaining good area except the defective rows and/or columns cannot be used effectively.

To replace the defective rows and/or columns with spare rows and/or columns in the memory cell array, an address-replacing logic circuit is used to replace row addresses and/or column addresses.

Here, there arise the problem that the address replacing logic circuit requires a complicated configuration in order to replace many defective rows and/or columns with spare rows and/or columns.

SUMMARY OF THE INVENTION

The object of the present invention is to provide a semiconductor memory that solves problems concerning the yield, the effective use of the normal area of the memory cell array, the configuration of the address-replacing logic circuit, and others that would be encountered in introducing redundancy techniques to the sequential-access memory using a serial address pointer like ordinary RAMs.

To achieve the foregoing object, a semiconductor memory of the present invention comprises: a memory cell array; a shift register containing multiple stages of shift circuits which is used as a serial address pointer for serially specifying the addresses of rows and/or columns actually used in the memory cell array; a bypass circuit capable of forming a bypass for the shift circuit at a given stage of the shift register; and a bypass control circuit for determining whether or not a bypass is to be formed by the bypass circuit.

This semiconductor memory can control the bypass control circuit according to the memory cell configuration and the state of defect occurrence as follows:

(a) In a case where the memory cell array is constructed so as to have redundant rows and/or columns in addition to as many rows and/or columns as required to obtain a certain memory capacity.

When die sort tests conducted after the completion of the wafer process in the manufacture of semiconductor memories have shown that there is neither defective rows nor columns in the memory cell array, the bypass control circuit is controlled so that the shift circuit at a particular stage of the shift register may be bypassed. This prevents the shift circuit at the particular stage of the shift register from specifying the address for the particular row and/or column in the memory cell array, which makes it possible to realize a memory with a certain memory capacity.

In contrast, when it has been found that there are not as many defective rows and/or columns as there are the redundant rows and/or columns in the memory cell array, the bypass control circuit is controlled so that the shift circuits corresponding to the defective rows and/or columns may be bypassed. This prevents the shift circuit from specifying the addresses for the defective rows and/or columns in the memory cell array, which makes it possible to realize a memory with a certain memory capacity.

If there are still extra rows or columns left after bypassing defective rows and/or columns, a certain number of non defective rows or columns needs to be also bypassed in order to realize a memory with a certain (predetermined) capacity.

When it has been found that there are more defective rows and/or columns than there are the redundant rows and/or columns in the memory cell array, the bypass control circuit is controlled so that the shift circuits corresponding to the defective rows and/or columns may be bypassed. This prevents the shift circuits from specifying the addresses for the defective rows and/or columns in the memory cell array, which makes it possible to obtain a memory with an effective capacity determined by the normal remaining rows and columns except the defective rows and/or columns (a memory with an irregular bit capacity).

(b) In a case where the memory cell array is constructed so as to have just as many rows and/or columns as required to obtain a certain memory capacity (with neither redundant rows nor redundant columns).

When it has been found that there is neither defective rows nor defective columns in the memory cell array, a memory with a certain memory capacity can be obtained.

When it has been found that there are a defective row and/or column in the memory cell array, the bypass control circuit is controlled so that the shift circuits corresponding to the defective rows and/or columns may be bypassed. This provides a memory with an effective capacity determined by the remaining normal rows and columns except the defective rows and/or columns (a memory with an irregular bit capacity).

Therefore, with such a semiconductor memory, it is possible to introduce redundancy techniques different from the conventional concept of providing spare rows and/or columns in a particular location in the memory cell array. It is further possible to achieve the remedy of faulty chips, improvements in the yield, the effective use of the normal area of the memory cell array, and the elimination of the address-replacing logic circuit. Additionally, the circuit configuration of a newly required bypass circuit and bypass control circuit may be simple.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic block diagram of a sequential-access memory according to a first embodiment of the present invention;

FIG. 8 is a circuit diagram of a further modification of the bypass control circuit of FIG. 2;

FIG. 9 is a circuit diagram of a still further modification of the bypass control circuit of FIG. 2;

FIG. 11 is a schematic circuit diagram of a serial-access DRAM according to a third embodiment of the present invention;

FIG. 15 is a circuit diagram of a modification of the word-line driving circuit of FIG.

FIG. 17 is a block diagram of a dual port VRAM according to a fifth embodiment of the present invention.

DETAILED DESCRIPTION OF THE PREFERRED EMBODIMENTS

Figure 2:
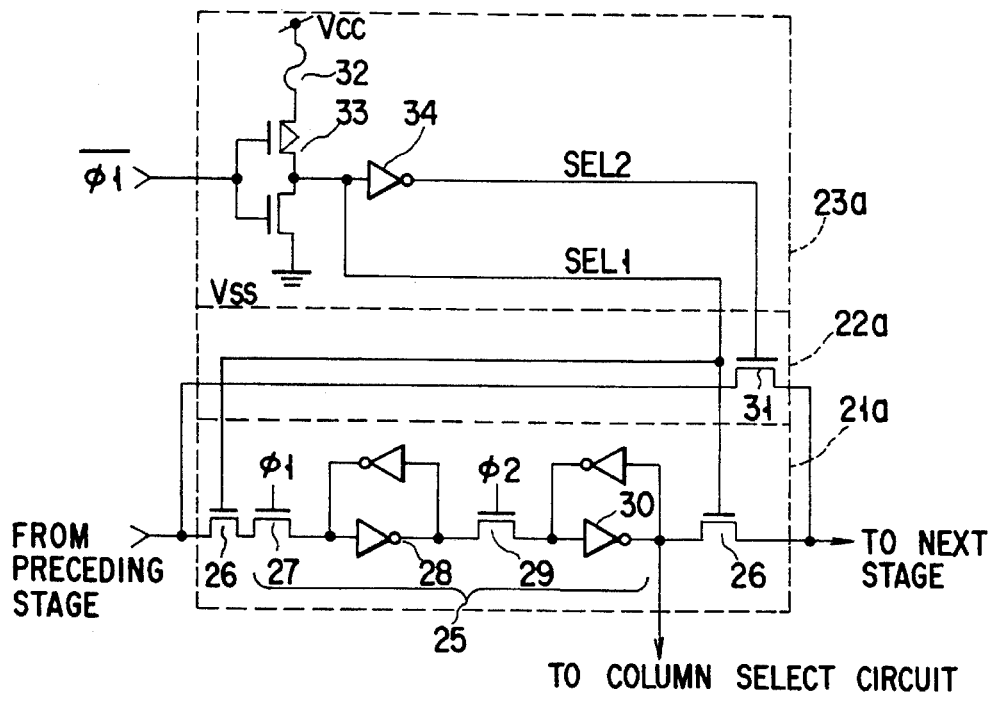
FIG. 2 is a circuit diagram of an example of a stage of the shift register, a unit of the bypass circuit, and a unit of the bypass control circuit in FIG. 1.

Hereinafter, referring to the accompanying drawings, embodiments of the present invention will be explained. Like parts are shown by like reference characters throughout all the drawings for the purpose of avoiding their repetitious explanation.

FIG. 1 is a schematic block diagram showing the construction of a sequential-access memory whose memory array cells are provided with redundancy, according to a first embodiment of the present invention.

In FIG. 1, a memory cell array 10 contains memory cells MC arranged in matrix form, word lines WL each connected to all the memory cells in the same row, and bit lines BL each connected to all the memory cells in the same column.

The memory cell array 10 is constructed so as to have spare k' columns (k' is an integer, normally 1, 2, 4, 8, ...) in addition to n rows and m columns required to obtain a certain memory capacity.

In FIG. 1, it is also possible to have redundant rows, but they are not included in the following explanation for simplicity.

Numeral 11 indicates a row decoder for decoding the row address signal to selectively drive the individual row lines in the memory cell array 10. This row decoder 11 contains a plurality of word-line select circuits for specifying a word line to be selected in the memory cell array 10, and a plurality of word-line driving circuit, driven by the corresponding word-line select circuits, for independently driving the selected k (k is an integer, normally 1, 2, 4, 8, ...) word lines in the memory cell array 10.

Numeral 12 indicates a sense amplifier provided for each column in the memory cell array 10.

Numeral 13 denotes a column select circuit for selecting columns in the memory cell array in units of k' columns, which contains as many select circuits as 1/k' of the number of columns (m+k') in the memory array 10, or (m/k')+1.

Numeral 21 designates a serial address pointer shift register for producing an address-specifying signal to serially specify column addresses used in the memory cell array 10 and supplying this signal to the column select circuit 13 for select control.

The shift register 21 contains as many stages of shift circuits as 1/k' of the number of columns (m+k') in the memory cell array 10, or (m/k')+1, and forms a ring circuit so that the final-stage output may be the first-stage input, the output of the shift circuit at each stage being supplied as a control input to the corresponding select circuits of the column select circuit 13.

The number of spare (redundant) columns in the above explanation is k', which is the number of columns driven by one stage of the shift register. However, it should be noted that the number of spare columns can be more than k' (i.e., 2k', 4k'. ...).

The shift register 21 is constructed so that the output of the address-specifying signal may begin at the shift register stage for specifying the start address (for example, the initial stage) when the operation of serially specifying column addresses begins in the memory cell array 10.

Numeral 22 indicates a bypass circuit capable of forming a bypass for a given stage of the shift register 21 (for example, the stage specifying the address corresponding to the defective column in the memory cell array 10), which is provided for each stage of the shift register 21.

Numeral 23 denotes a bypass control circuit for determining whether or not a bypass is to be formed by the bypass circuit 22, which is provided so as to meet the number of the bypass circuits 22, or the number of stages of the shift register 21.

The shift register 21, bypass circuit 22, and bypass control circuit 23 are placed to one side of the memory cell array across which columns are arranged side by side.

FIG. 2 is a circuit diagram of a stage 21a of the shift register, a unit 22a of the bypass circuit, and a unit 23a of the bypass control circuit.

The shift register stage 21a contains a shift circuit 25 composed of a master-slave flip-flop, a first switch gate (an n-channel MOS transistor) 26 inserted and connected in series in the output side of the shift circuit 25 (between the output terminal of the shift circuit 25 and the output terminal of the shift register stage).

The shift circuit 25 is constructed by serially connecting a first data transfer gate (an n-channel MOS transistor) 27, a master flip-flop 28, a second data transfer gate (an n-channel MOS transistor) 29, and a slave flip-flop 30. The first and second data transfer gates 27 and 29 are switch-driven by data transfer clocks $\phi 1$ and $\phi 2$ of two phases (or complementary phases) with no overlap to turn on alternately.

When the shift register stage 21a is used and the data is transferred, the first switch gates 26 are placed in the on state.

The bypass circuit 22a has a second switch gate (an n-channel MOS transistor) 31 connected in parallel across the input terminal and the output terminal of the corresponding shift register stage 21a.

When the bypass circuit 22a is used, the second switch gate 31 is set in the on state.

The bypass control circuit 23a, which contains a program element 32, functions with the program element being programmed, in such a manner that the bypass circuit 22a corresponding to the shift register stage 21a to be bypassed may be used, and at the same time, the shift register stage 21a may not be used.

The bypass control circuit stage 23a contains a program element (for example, a polysilicon fuse element) 32 connected in series between the power supply potential ($V_{CC}$) node and the ground potential ($V_{SS}$) node, a first CMOS inverter 33, and a second CMOS inverter 34 whose input node is connected to the output node of the first inverter 33.

The first inverter 33 has the common gate junction node (input node) of a PMOS transistor and an NMOS transistor supplied with the inverted signal/$\phi 1$ of the data transfer clock $\phi 1$. A first select signal SEL1 is supplied from the output node of the first inverter 33 to the first switch gates 26 of the corresponding shift register stage 21a.

A second select signal SEL2 is supplied from the output node of the second inverter 34 to the second switch gate 31 of the corresponding bypass circuit stage 22a.

Here, the operation of the bypass control circuit 23a and bypass circuit 22a will be explained.

With power being supplied normally, when the inverted signal/$\phi 1$ input to the bypass control circuit 23a is activated (goes to a low (Lo) level), the first select signal SEL1 goes to a high (Hi) level and the second select signal SEL2 goes to the Lo level. As a result, the first switch gates 26 of the shift register stage 21a corresponding to the bypass control circuit 23a is placed in an on state, and the second switch gate 31 of the bypass circuit 22a corresponding to the bypass control circuit 23a is placed in an off state. Namely, the shift register stage 21a is in an operative state and the bypass circuit 22a is in an inoperative state, which allows the shift register stage 21a to specify an address. In this state, no current passes through between $V_{CC}$ node and $V_{SS}$ node of the bypass control circuit 23a.

In contrast, when the program element 32 of the bypass control circuit 23a is previously programmed (in this embodiment, fuse elements are previously fused), the first select signal SEL1 goes to the Lo level and the second select signal SEL2 goes to the Hi level with power being supplied. As a result, the first switch gates 26 of the shift register stage 21a corresponding to the bypass control circuit 23a is placed in the off state, and the second switch gate 31 of the bypass circuit 22a corresponding to the bypass control circuit 23a is placed in the on state. Namely, the shift register stage 21a is in an inoperative state and the bypass circuit 22a is in an operative state, which prevents the shift register stage 21a from specifying an address. In this state, no current passes through between $V_{CC}$ node and $V_{SS}$ node of the bypass control circuit 23a.

Since in this state, there is a possibility that the output node (the first select signal SEL1) of the first inverter 33 is in a floating state in terms of potential, it is necessary to precharge (refresh) the output node to the Lo level by sometimes bringing the inverted signal/$\phi 1$ into the Hi level to turn on the NMOS transistor of the first inverter 33.

Figure 3:
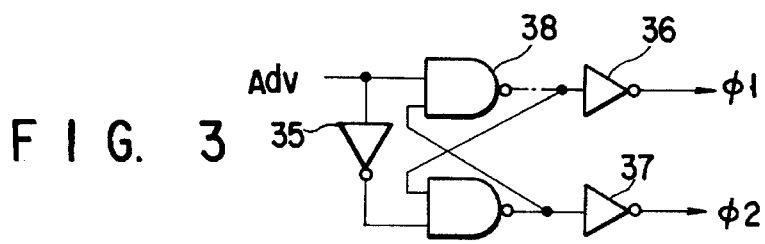
FIG. 3 is a circuit diagram of a clock generator circuit that produces transfer clocks $\phi 1$ and $\phi 2$ in FIG. 2.

FIG. 3 is a circuit diagram of a clock generator circuit that produces transfer clocks $\phi 1$ and $\phi 2$ for the shift register stage 21a of FIG. 2.

In FIG. 3, numerals 35 through 37 indicate inverter circuits, and 38 denotes a flip-flop circuit. In a waiting state of the memory operation, the input signal Adv is at the Lo level, clock $\phi 1$ is at the Lo level, and clock $\phi 2$ is at the Hi level.

Figure 4:
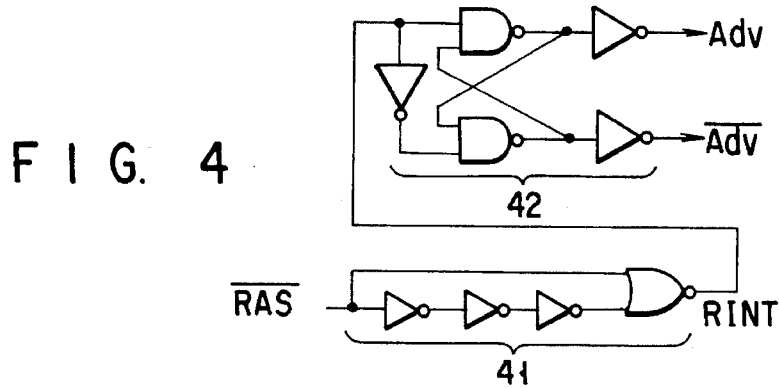
FIG. 4 is a circuit diagram of an advance signal generator circuit that produces the input signal Adv in FIG. 3.

FIG. 4 is a circuit diagram of an advance signal generator circuit that produces the input signal Adv in FIG. 3.

In FIG. 4, a circuit section 41 supplies a specified-width pulse signal RINT when the row address strobe (/RAS) signal input to the memory is activated (goes to the Lo level). The circuit section 42, when receiving the pulse signal RINT, produces complementary signals Adv and/Adv.

Therefore, when/RAS signal input is activated, transfer clocks $\phi 1$ and $\phi 2$ are generated, which allows the shift register 21 to supply an address-specifying signal for serially specifying columns in the memory cell array 10.

Next explained will be the operation of a portion concerning the redundant arrangement in the FIG. 1 sequential-access memory.

When die sort tests after the completion of wafer processes have shown that there is no defective rows in the memory cell array 10, a particular stage of the shift register (for example, the final stage) is bypassed. To do this, control is done by fusing the fuse element 32 of the bypass control circuit 23a provided for the shift register stage 21a to be bypassed, so that the bypass circuit 22a corresponding to the bypass control circuit 23a may be used and the shift register stage 21a may not be used.

This prevents the shift register stage 21a from specifying an address, which makes it possible to realize a memory with a required particular memory capacity (n rows×m columns).

In contrast, when it has been found that there are defective column(s) corresponding to one shift register stage in the memory cell array 10, control is done so that the shift register stage 21a corresponding to the defective column may be bypassed.

This prevents the shift register stage 21a from specifying an address, which makes it possible to realize a memory with a required particular memory capacity (n rows×m columns).

When it has been found that there are two or more defective columns corresponding to more than 2 shift register stages in the memory cell array 10, control is done so that multiple shift register stages 21a corresponding to those defective columns may be bypassed.

This prevents the multiple shift register stages 21a from specifying addresses, which makes it possible to obtain a memory with an effective memory capacity corresponding to the remaining normal rows and columns (a memory with an irregular bit capacity).

Number of redundant shift register can be more than 2 in the above embodiment.

Next explained will be a case where the memory cell array 10 is constructed so as to have only rows and columns necessary to obtain a certain memory capacity (n rows×m columns) without any redundant column.

When it has been found that there is no defective row in such a memory cell array 10, it is possible to achieve a memory cell with a certain memory capacity.

In contrast, when it has been found that there are one or more defective columns in the memory cell array 10, control is done so that the register stages 21a corresponding to the defective columns may be bypassed, which makes it possible to obtain a memory with an effective memory capacity corresponding to the remaining normal rows and columns (a memory with an irregular bit capacity).

As described above, with the sequential-access memory of FIG. 1, it is possible to introduce redundancy techniques different from the conventional concept that spare rows and/or columns are provided in a particular position in the memory cell array. This makes it possible to realize a memory with a certain memory capacity, or to obtain a memory with an effective capacity corresponding to the remaining normal rows and columns except the defective columns in the memory cell array 10.

Consequently, it is possible to remedy defective chips, improve the yield, effectively use the normal area of the memory cell array, and eliminate the address-replacing logic circuit. Additionally, a newly required bypass circuit 22 and bypass control may be constructed simply.

While in the above embodiment, the bypass circuit capable of bypassing a single stage of the shift register is used, such a bypass circuit as bypassing consecutive or distributed two or more stages of the shift register may be used as required, when the memory cell array is constructed so as to have two or more spare columns in addition to n rows×m columns necessary for obtaining a certain memory capacity.

Further, in the above embodiment, when it has been found that there is no defective column in the memory cell array 10, particular stages (for example, the certain final stages) of the shift registers are bypassed, and the fuse element 32 of the bypass control circuit 23a provided for these final stages are fused.

If the bypassed stage of the shift register outputs a column selecting signal, then multiple column selection occurs. In order to avoid this situation, shift register is designed to be initialized not to output the column selection signal when power is on.

The present invention, however, is not limited to the above embodiment. For instance, concerning the final stage of the shift register and the bypass circuit 22a provided for the stage, connection may be made so that the first select signal SEL1 and the second select signal SEL2 from the bypass control circuit 23a may be supplied reversely.

By doing this, when it has been found that there is no defective column in the memory cell array, the final stage of the shift register can be bypassed even if the fuse element 32 of the bypass control circuit 23a is not fused, so that the final stage becomes inoperative.

In contrast, when it has been found that there is a defective column in the memory cell array 10, control must be done so that a shift register stage 21a other than the final stage of the shift register may be bypassed. In this case, the final stage of the shift register is not bypassed (or the final stage is used), and it is necessary to fuse the fuse element 32 of the bypass control circuit 23a provided for the final stage of the shift register in addition to the stage corresponding to the defective column.

FIGS. 5 through 9 are circuit diagrams of modifications of the bypass control circuit 23a in FIG. 2.

Figure 5:
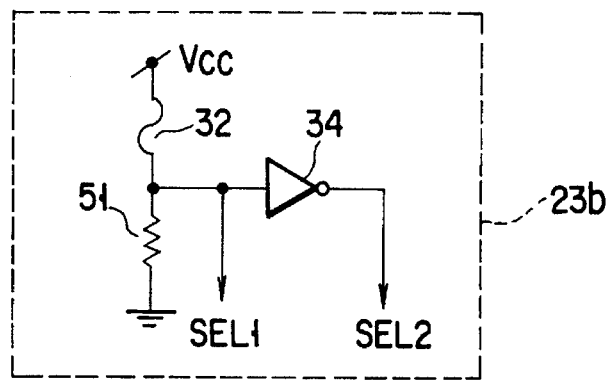
FIG. 5 is a circuit diagram of a modification of the bypass control circuit of FIG. 2.

The bypass control circuit 23b shown in FIG. 5 differs from the bypass control circuit 23a of FIG. 2 in that a resistor 51 is used in place of the first inverter 33.

Figure 6:
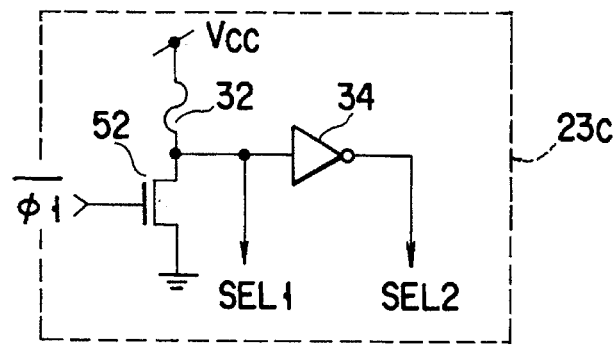
FIG. 6 is a circuit diagram of another modification of the bypass control circuit of FIG. 2.

The bypass control circuit 23c shown in FIG. 6 differs from the bypass control circuit 23a of FIG. 2 in that an NMOS transistor 52 is used in place of the first inverter 33.

Figure 7:
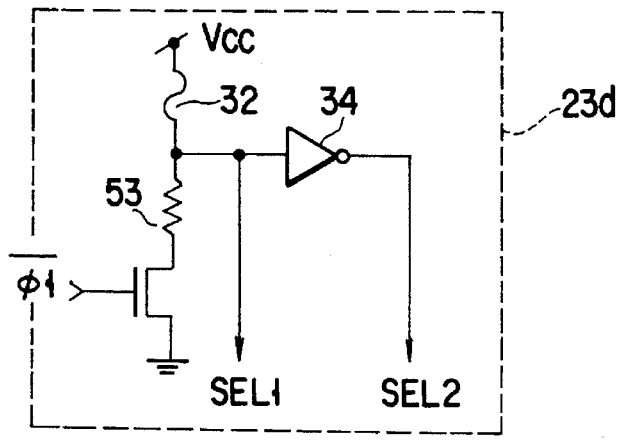
FIG. 7 is a circuit diagram of still another modification of the bypass control circuit of FIG. 2.

The bypass control circuit 23d shown in FIG. 7 differs from the bypass control circuit 23a of FIG. 2 in that a resistive load NMOS inverter 53 is used in place of the first inverter 33.

The bypass control circuit stages 23b through 23d shown in FIGS. 5 through 7 have the disadvantage that current flows through between $V_{CC}$ node and $V_{SS}$ node.

The bypass control circuit 23e shown in FIG. 8 differs from the bypass control circuit 23a of FIG. 2 in that a third inverter 54 is further added between the output node and the input node of the second inverter 34 to form a latch circuit, and an initialize signal (reset signal) is supplied to the first inverter 33 before a normal operation is started.

In the bypass control circuit 23e of FIG. 8, when the fuse element 32 is not fused, the first select signal SEL1 is at the Hi level and the second select signal SEL2 is at the Lo level with power being supplied.

This places the first switch gates 26 of the shift register stage 21a corresponding to the bypass control circuit 23e in the on state and the second switch gate 31 of the bypass circuit 22a corresponding to the bypass control circuit 23e in the off state.

In contrast, with the fuse element 32 being fused, when a Hi level initialize signal is supplied to the first inverter 33 before a normal operation is started, the first select signal SEL1 is latched at the Lo level and the second select signal SEL2 is latched at the Hi level.

This places the first switch gates 26 of the shift register stage 21a corresponding to the bypass control circuit 23e in the off state and the second switch gate 31 of the bypass circuit 22a corresponding to the bypass control circuit 23e in the on state.

In this case, since the output node (the first select signal SEL1) of the first inverter 33 is latched at the Lo level by the latch circuit, it is unnecessary to supply a Hi level refresh signal to the first inverter 33.

If the fuse element 32 is eliminated (or, the fuse element 32 is provided but left unfused), when a Hi level initialize signal is not supplied to the first inverter 33 before a normal operation starts, the first select signal SEL1 is at the Hi level and the second select signal SEL2 is at the Lo level.

This places the first switch gates 26 of the shift register stage 21a corresponding to the bypass control circuit 23e in the on state and the second switch gate 31 of the bypass circuit 22a corresponding to the bypass control circuit 23e in the off state.

In contrast, when a Hi level initialize signal is supplied to the first inverter 33, the first select signal SEL1 is latched at the Lo level and the second select signal SEL2 is latched at the Hi level.

This places the first switch gates 26 of the shift register stage 21a corresponding to the bypass control circuit 23e in the off state and the second switch gate 31 of the bypass circuit 22a corresponding to the bypass control circuit 23e in the on state.

The bypass control circuit 23f shown in FIG. 9 differs from the bypass control circuit 23a of FIG. 2 in that an NMOS transistor 55 is further added between the output node of the first inverter 33 and $V_{SS}$ node with the gate of this transistor being connected to the output node of the second inverter 34, and the initialize signal (reset signal) is supplied to the first inverter 33 before a normal operation is started.

The bypass control circuit 23f of FIG. 9 functions as does the bypass control circuit 23e of FIG. 8.

By programming the program element 32 of the bypass control circuit 23a corresponding to the shift register stage 21a, the circuit shown in FIG. 2 performs control so that the bypass circuit 22a corresponding to the shift register stage 21a may be used and, at the same time, the shift register stage 21a corresponding to the stage may not be used.

The present invention, however, is not limited to the configuration shown in FIG. 2. For instance, it is possible to use the bypass circuit 22a corresponding to the shift register stage 21a and, at the same time, to prohibit the output of the shift register stage 21a from being used by programming the program element 32 of the bypass control circuit 23a corresponding to the next or preceding stage of the shift register stage 21a.

There are bypass control circuits which can generate the SEL1 signal to be almost identical to φ, when it is not programmed (fuse element is not blown). For these bypass control circuits, such as 23a, 23c and 23d, the transfer gate 27 can be eliminated, because one of the first switching gates 26 next to 27 acts as a transfer gate, too. In FIG. 1, bypass control circuit (23), bypass circuit (22) and shift register (21) can be used to drive more than 2 memory cell arrays. For example, they are placed in the middle of two memory cell arrays, or the shift register output is provided across plural of memory cell arrays.

Figure 10:
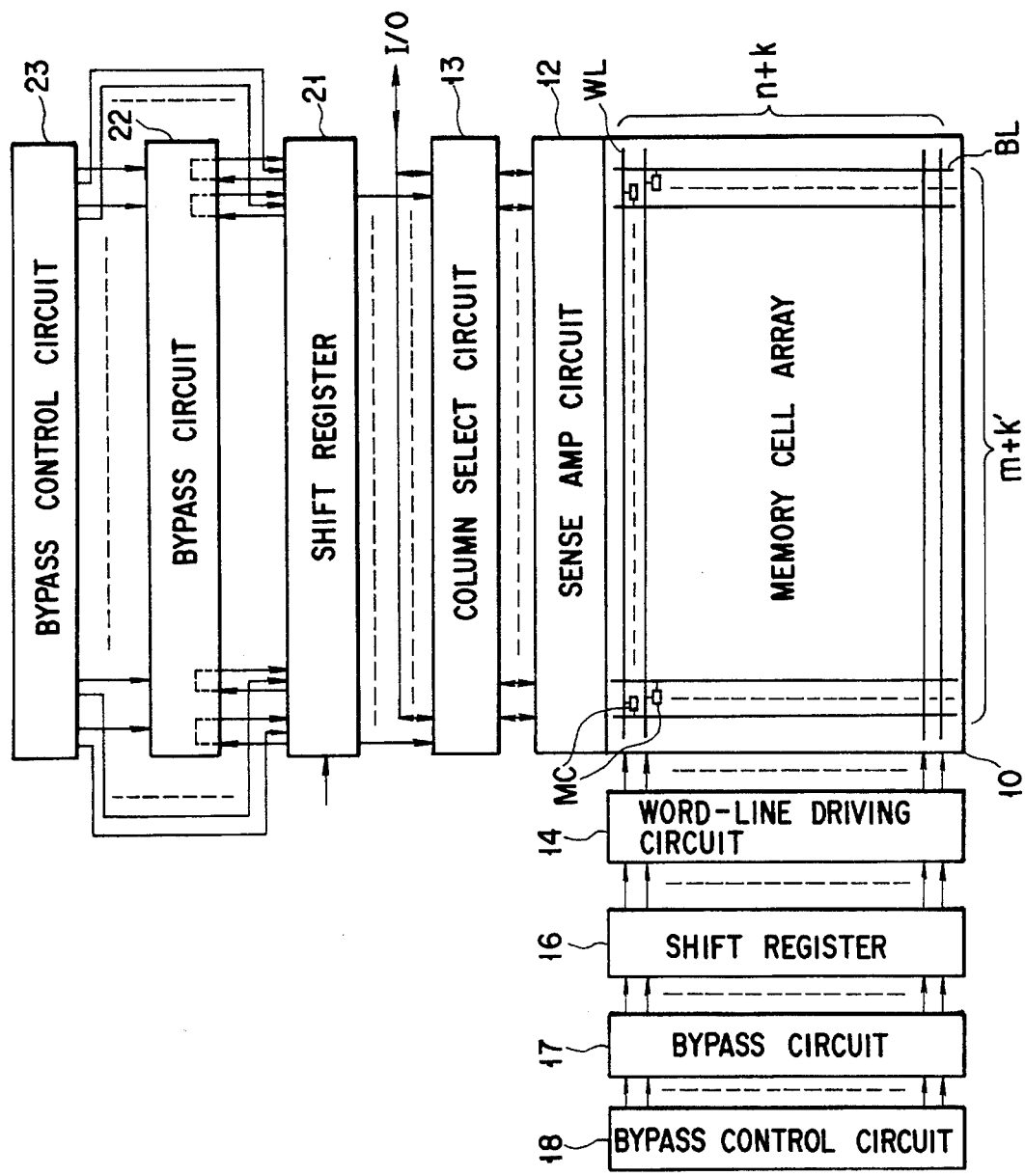
FIG. 10 is a block diagram of a semiconductor memory according to a second embodiment of the present invention.

FIG. 10 is a block diagram of a semiconductor memory according to a second embodiment of the present invention.

In the semiconductor memory of the second embodiment, which provides redundancy for rows, there are a word-line driving circuit 14, a row address-specifying shift register 16, a bypass circuit 17, and a bypass control circuit 18 to one side of the memory cell array across which rows are arranged side by side.

The memory cell array 10 contains redundant k (an integer) rows in addition to n (an integer) rows and m (an integer) columns required to obtain a certain memory capacity, or contains n (an integer) rows and m (an integer) columns required to obtain a certain memory capacity.

The shift register 16 contains as many stages as 1/k of the number of rows in the memory cell array 10. The bypass circuit 17 and bypass control circuit 18 are provided for each stage of the shift register 16.

In this embodiment, word line driving circuit (14), a row shift register (16), a bypass circuit (17), and a bypass control circuit (18) can be used to drive more than 2 memory cell arrays. For example, they are placed in the middle of two memory arrays, or the shift register output is provided across plural of memory cell arrays. In addition, the number of redundant rows can possible be more than k (i.e. 2k, 4k . . . ).

Additionally, by providing a column address-specifying shift register 21, a bypass circuit 22, and a bypass control circuit 23 to one side of the array across which columns are arranged side by side, and by adding redundant k' columns to the memory cell array 10, redundancy can be introduced to the columns like the rows.

Column shift register (21), a bypass circuit (22), and bypass control circuit (23) can be used to drive more than 2 memory cell arrays. For example, they are placed in the middle of two memory cell arrays, or the shift register output is provided across plural of memory cell arrays.

Conventional random access may be done for the columns to introduce a conventional decoder and a redundancy circuit.

Further, the present invention is not limited to the above-described sequential access, and may be applied to semiconductor memories disclosed in U.S. patent application Ser. No. 721,255 assigned to the inventor of the present invention (Published Unexamined Japanese Patent Application No. 3-41316).

The semiconductor memory of U.S. patent application Ser. No. 721,255 comprises an array of memory cells each capable of storing multiple bits of information in bits, and storage means for temporarily storing multiple bits of information read time-sequentially from the memory cell.

The memory cell contains a plurality of MOS transistors connected in series, and memory storage capacitors one end of each of which is connected to one end of each of the MOS transistors.

With the semiconductor memory of U.S. patent application Ser. No. 721,255, it is possible to read the information stored in the respective capacitors from the memory cell in sequence onto bit lines and, at the same time, store the stored information into the storage means, and write the information on the bit lines into the respective capacitors in the memory cell.

The present invention may also be applied to serial-access semiconductor memories disclosed in U.S. patent application Ser. No. 03074830 assigned to the inventor of the present invention (Published Unexamined Japanese Patent Application No. 4-48312).

The serial-access semiconductor memory of U.S. patent application Ser. No. 03074830, which allows serial access to multiple memory cells in the same column in the above-mentioned memory cell capable of storing the multiple bits of information in bits, is provided with access means that, when a memory cell is to be read from and written into, reads multiple bits of information time-sequentially from the memory cell storing the information and sequentially rewrites the multiple bits of information into another unused memory cell in the same column.

when the present invention is applied to the serial-access semiconductor memory and all memory cells in the same column in the memory cell array are serially accessed, the start address (row address) for access start must be shifted for each serial access.

FIG. 11 is a circuit diagram of a column in a DRAM of the serial-access semiconductor memory to which the present invention is applied.

In the DRAM, which introduces redundancy to the rows in the memory cell array, there are a word-line driving circuit 14, a shift register 21 for specifying row addresses serially, a bypass circuit 22, and a bypass control circuit 23 to one end of the memory cell array across which rows are arranged side by side. The DRAM also contains a column address-specifying column decoder 19.

The memory cell array is constructed so as to have redundant rows in addition to the necessary rows to obtain a certain memory capacity (including the rows required to temporarily store the read-out data). Rows actually selected for use by the shift register 21 belong to the necessary rows to obtain a certain memory capacity except the redundant rows.

The following explanation is given, centering on the actually used rows in the memory cell array.

In the memory cell array of FIG. 11, BL indicates bit lines, MC0 through MC(n+1) DRAM cells each capable of storing, for example, 4 bits of information in bits, and WL0a-WL0e through WLna-WLne word lines each connected to all cell transistors in the same row in the memory cell array. SA denotes a bit-line sense amplifier made up of, for example, a latch amplifier, PR a bit-line precharge circuit, CS a column select circuit switch controlled by the column decoder output CD, and I/O and/(I/O) input/output lines.

Each of the DRAM cells MC0 through MCn contains five MOS transistors Q1 through Q5 series-connected between a first node N1 and a second node N2 and a plurality of information storage capacitors C1 through C4 one end of each of which is connected to each junction node between the respective MOS transistors. The first node N1 and the second node N2 are connected to each other, and then connected to the bit line BL.

The gates of the individual MOS transistors Q1 through Q5 of the DRAM cell MC0 through MCn are connected to word lines WL0a-WL0e, . . . , WLna-WLne, respectively. The other ends of the capacitors C1 through C4 are all connected to the capacitor wire 11. In this embodiment, the plate electrodes of the capacitors C1 through C4 are connected to each other. To those plate electrodes, a specified capacitor plate potential $V_{PL}$ is supplied as are the other DRAM cells.

Figure 12:
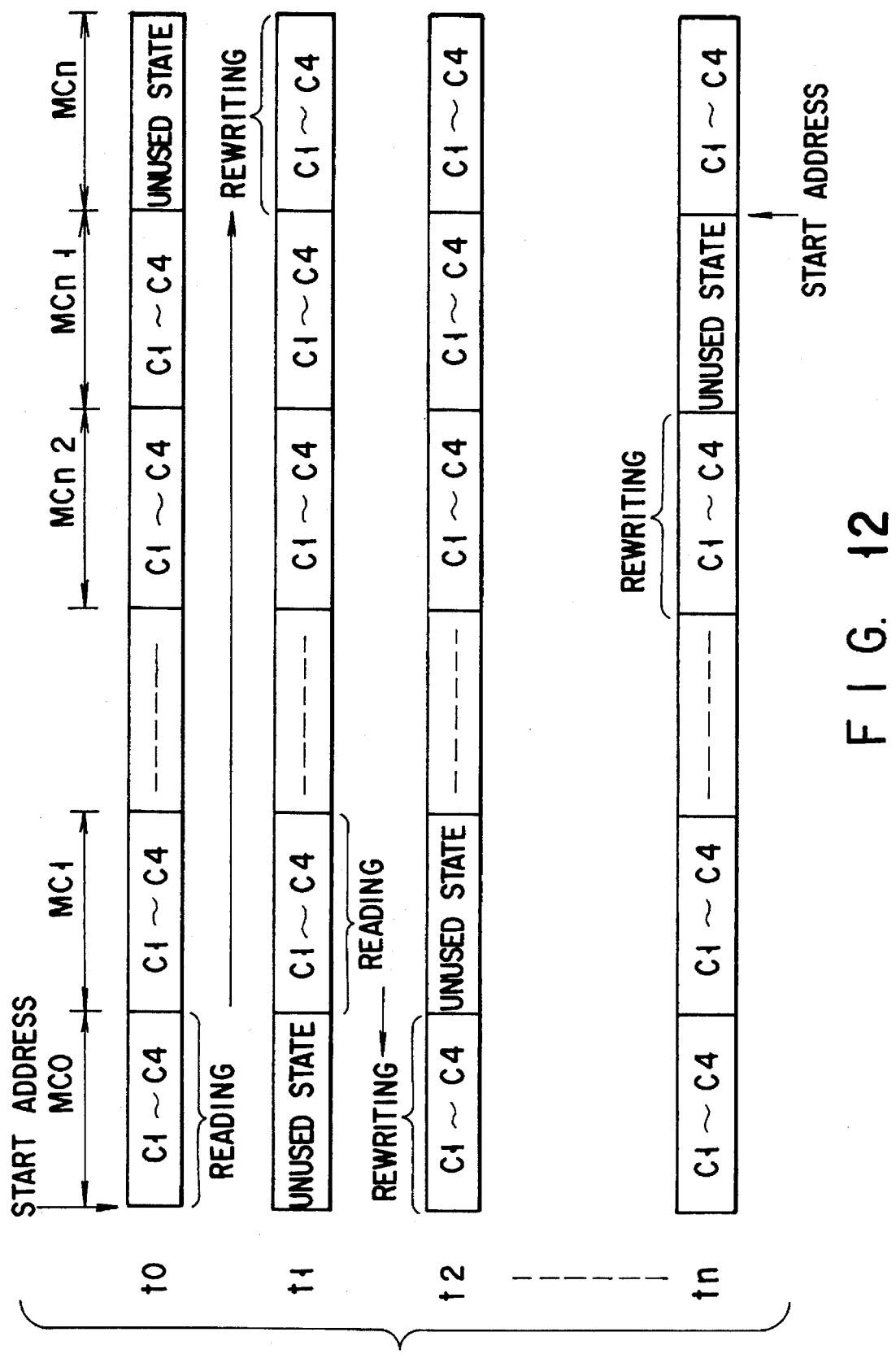
FIG. 12 is timing chart for explaining an example of serial access to memory cells in the same column in the FIG. 11 DRAM.

FIG. 12 is timing chart for explaining an example of serial access to memory cells in the same column in the FIG. 11 DRAM.

Briefly explained next, referring to FIG. 12, will be the serial access operation of sequentially reading the block data and, at the same time, rewriting it when a series of data (block data) is stored in cells MC0 through MC(n-1) in the DRAM and cell MCn is unused or has stored no data.

At time t0, the operation begins of sequentially reading the stored information in capacitors C1 through C4 in cell MC0 and then sequentially rewriting the 4-bit information into the capacitors C1 through C4 in another unused cell (at this time, corresponding to MCn) in the same column.

At time t1, the operation begins of sequentially reading the 4-bit information in cell MC1 and then sequentially rewriting it into another unused cell (at this time, corresponding to MC0) in the same column.

In the same way, the operation of sequentially reading 4 bits of information in cell MCi and rewriting it cell MC(i-1) is carried out in units of two memory cells, each combination different in reading and writing, with the result that at time tn, the 4-bit information in cell MC(n-1) is finally rewritten in cell MC(n-2).

By such a serial access, the block data has been stored in cell MCn, and MC0 through MC(n-2).

In the next serial access, the start address (the word-line address) in the preceding serial access is reduced by that for one cell. The operation of rewriting the read-out data from cell MCn into cell MC(n-1) is then begun, and finally, the read-out data from cell MC(n-2) is rewritten into cell MC(n-3).

By such serial access operations, the block data has been stored in cells MC(n-1), MCn, and MC0 through MC(n-3).

Figure 13:
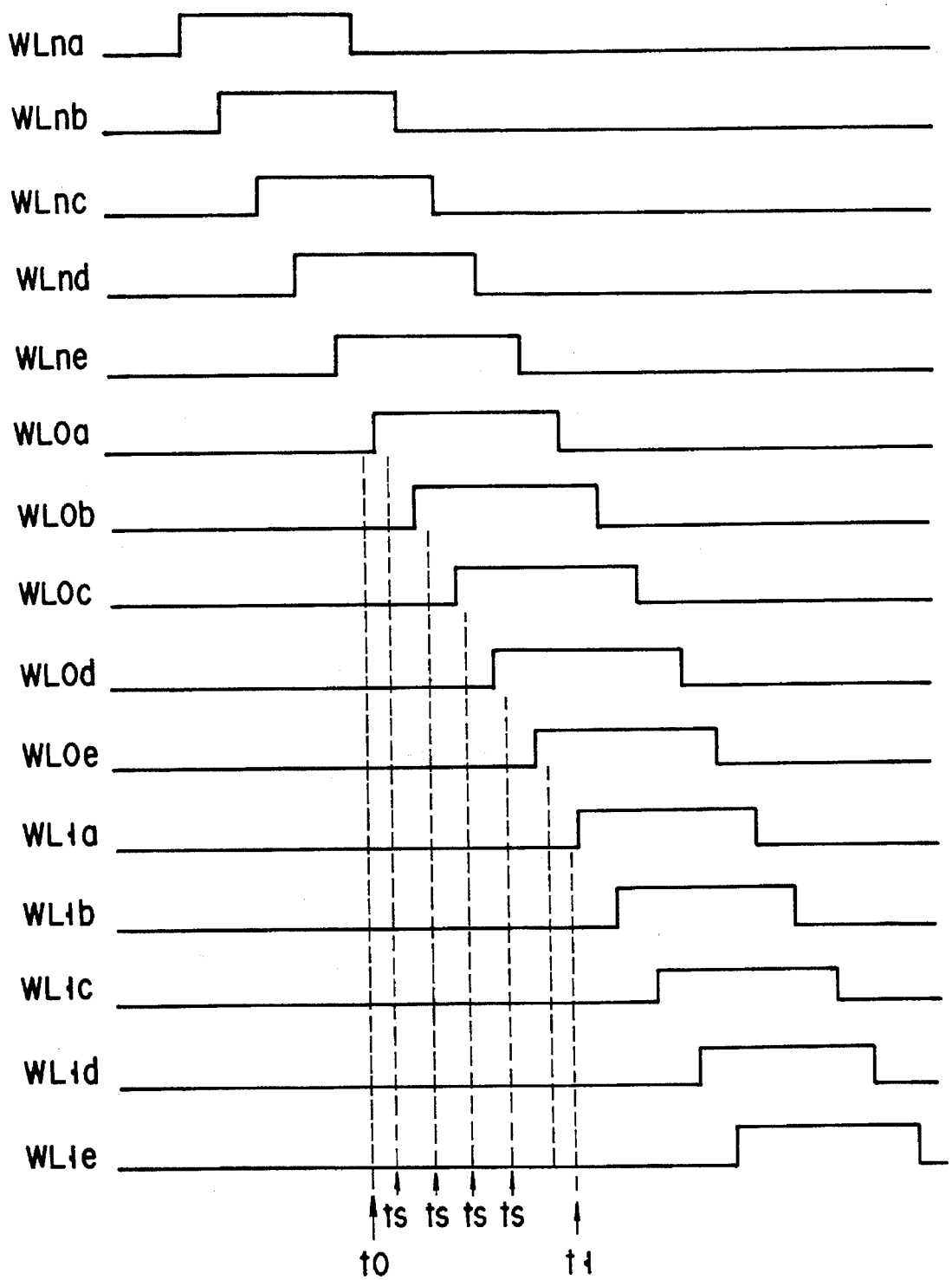
FIG. 13 is timing waveform diagrams for the operation of the FIG. 11 DRAM.

FIG. 13 is timing diagrams showing the representative portions of the above operation in the range from time t0 through time t1, where n-channel memory cell array is assumed.

First, the word lines WLna-WLne and WL0a-WL0e undergo on/off control so that the transistors of cell MCn may be turned off in the order of Q1 through Q5, and, with a certain timing with this, the transistors of cell MC0 be turned on in the order of Q1 through Q5. Then, when the transistor Q1 of cell MCn is off, the transistors Q2 through Q5 are on, and the transistors Q1 through Q5 of the other cells MC0 through MC(n-1) are off (at time t0), the bit line BL is precharged to a specified potential (for example, ½ of the power supply potential) by the bit-line precharge circuit PR.

In this state, when the transistor Q1 of cell MC0 is turned on, the stored information in the capacitor C1 of cell MC0 is read onto the bit line BL via transistor Q1 and, with timing ts, the sense amplifier SA operates to supply the read-out information. After the sense output places the rewrite potential on the bit line BL, when the transistor Q2 of cell MCn is turned off, the potential on the bit line BL (the stored information in the capacitor C1 of the cell MC0) is stored in the capacitor C1 of cell MCn.

Next, after bit line BL is precharged again, when the transistor Q2 of cell MC0 is turned on, the stored information in the capacitor C2 of cell MC0 is read onto bit line BL via transistors Q2 and Q1 and, with timing ts, sensed by the sense amplifier SA, which supplies the sensed signal. After this sense output has placed the rewrite potential on the bit line BL, when the transistor Q3 of cell MCn is turned off, the potential on the bit line BL (the stored information in the capacitor C2 of the cell MC0) is stored into the capacitor C2 of cell MCn.

Next, after bit line BL is precharged again, when the transistor Q3 of cell MC0 is turned on, the stored information in the capacitor C3 of cell MC0 is read onto bit line BL via transistors Q3 through Q1 and, with timing ts, sensed by the sense amplifier SA, which supplies the sensed signal. After this sense output has placed the rewrite potential on the bit line BL, when the transistor Q4 of cell MCn is turned off, the potential on the bit line BL (the stored information in the capacitor C3 of the cell MC0) is stored into the capacitor C3 of cell MCn.

Next, after bit line BL is precharged again, when the transistor Q4 of cell MC0 is turned on, the stored information in the capacitor C4 of cell MC0 is read onto bit line BL via transistors Q4 through Q1 and, with timing ts, sensed by the sense amplifier SA, which supplies the sensed signal. After this sense output has placed the rewrite potential on the bit line BL, when the transistor Q5 of cell MCn is turned off, the potential on the bit line BL (the stored information in the capacitor C4 of the cell MC0) is stored into the capacitor C4 of cell MCn.

After this, the transistor Q5 of cell MC0 is turned on, and then the transistor Q1 is turned off (this off sequence may be reversed and carried out by time t1 when the operation begins of reading the stored information in the next cell MC1 and rewriting it into cell MC0).

This places the transistor Q1 of cell MC0 in the Off state, the transistors Q2 through Q5 in the on state, and the transistors Q1 through Q5 of the other cells MC1 through MCn in the off state, waiting to read from the next cell MC1 and rewrite into the cell MC0.

In this state, the word lines WL0a-WL0e and WL1a-WL1e undergo on/off control so that the transistors of cell MC0 may be turned off in the order of Q2 through Q5, and, with a certain timing with this, the transistors of cell MC1 be turned on in the order of Q1 through Q5. This makes it possible to read the stored information from the cell MC1 and rewrite it into the cell MC0 in a similar manner to the operation of reading the stored information from the cell MC0 and rewriting it into the cell MCn, as mentioned earlier.

For writing in the DRAM, the necessary data only has to be placed onto the bit line BL with rewrite timing as mentioned above. By selectively connecting each column and the data input/output circuit by means of the input/output lines I/O and/(I/O), the writing of input data and the transfer of read-out data to the output side are done.

The refresh operation of DRAM cells can be done by performing the aforementioned serial access with the column select switch off. In this case, in response to an externally applied refresh signal, or to the output of a refresh timer circuit (not shown) built in, the refresh operation may be done at regular intervals according to the timer output.

With the DRAM of FIG. 13, by turning on the transistors Q1 through Q5 of the cell to be read from, the stored information in the respective capacitor Q1 through Q4 is read sequentially onto bit line BL and, at the time when the sense amplifier SA operates at each reading, can be read outside the DRAM chip. That is, the four pieces (4 bits) of digital information can be read in the determined order.

Since such a reading operation is performed sequentially on n (for example, n=128) memory cells in the column in which information has been stored, 4 bits×128=512 bits (64 bytes) can be read from a single column in sequence.

Further, since the information time-sequentially read from a cell is rewritten into another cell in the same column, storage means for temporarily storing the information time-sequentially read from a cell for rewriting is unnecessary, which enables high integration, helping to achieve a very small chip size.

The sense amplifier SA is not restricted to the latch amplifier used in the above embodiment. For instance, a differential amplifier that compares the bit-line potential with a reference potential may be used and, based on the sense output, a write circuit (not shown) may place the rewrite potential on bit line BL.

With the FIG. 11 DRAM, by sequentially selecting more columns and accessing in such a manner that the start address is decreased by that for one cell each time column selection is made, for example, one column at a time, it is possible to sequentially read bits from more than one column.

The FIG. 11 DRAM uses n+1 sets of word-line driving circuits, each set containing five circuits. Corresponding to n+1 sets of word lines WL0a-WL0e through WLna-WLne in the memory cell array, each set containing five lines, n+1 stages of shift registers are used. A bypass circuit and a bypass control circuit are provided for each stage of the shift register.

In other words, the shift register uses as many stages as 1/k (in this embodiment, 1/5) (k is an integer) of the number of rows in the memory cell array. The word-line driving circuits are as many as the number of rows in the memory cell array. In this case, for select control of each set of word-line driving circuits corresponding to each stage output of the shift register, the output of each stage of the shift register is supplied as the operating power supply for each set of word-line driving circuits or the operation control signal.

Figure 14:
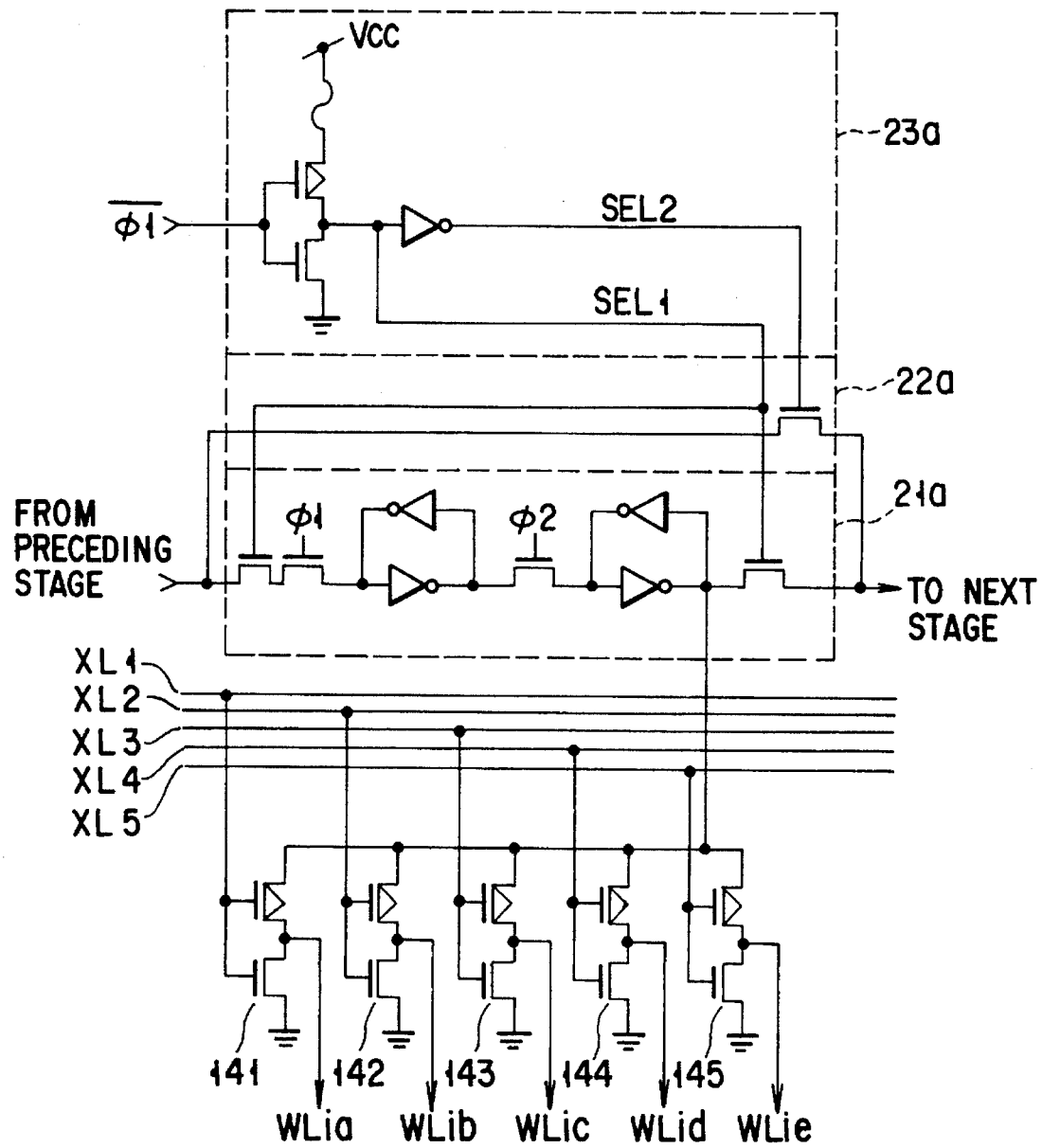
FIG. 14 is a circuit diagram of an example of the shift register and word-line driving circuit in FIG. 11.

FIG. 14 is a circuit diagram of a stage 21a of the shift register used to serially specify row addresses in the FIG. 11 DRAM, a unit 22a of the bypass circuit, a unit 23a of the bypass control circuit, and a set of word-line driving circuits 141 through 145 supplied with the operating power supply from the shift register stage 21a.

In FIG. 14, the shift register stage 21a, bypass circuit 22a, and bypass control circuit 23a are constructed as shown in FIG. 2.

Five word-line driving circuits 141 through 145 forming a set are each made up of, for example, CMOS inverters, and drive the corresponding set of five word lines WLia-WLie, respectively, of the word lines WL0a-WL0e through WLna-WLne. To supply the driving input in sequence to each set of five word-line driving circuits 141 through 145, five wires XL1 through XL5 are provided.

By using the circuit shown in FIG. 14, control can be done in such a manner that the operation of sequentially placing five word lines WLia-WLie in the on state at regular intervals in a serial access is performed on n+1 sets of word lines WL0a-WL0e through WLna-WLne in sequence.

If the fuse element in 23a is blown, the corresponding stage of the shift register always output "Lo" status and thus the corresponding 5 word lines are always disabled.

FIG. 15 is a circuit diagram of a modification of the word-line driving circuits 141 through 145 in FIG. 14.

In FIG. 15, for the output of the shift register stage 21a to drive the corresponding set of five wordline driving circuits 151 through 155, the shift register output is supplied as the operation control signal to the corresponding set of word-line driving circuits 151 through 155. Each of the word-line driving circuits 151 through 155 has an operation control PMOS transistor 16, a word-line driving PMOS transistor 17, and word-line pull-down NMOS transistor 18 series-connected between $V_{CC}$ (word line driving power supply, either externally supplied or internally generated) node and $V_{SS}$ node.

In the five word-line driving circuits 151 through 155, the individual gates of the operation control PMOS transistors 16, . . . are supplied with the corresponding shift register stage outputs, the individual gates of the word-line driving PMOS transistors 17, . . . are supplied in sequence with the word select signal, and the individual gates of the word-line pull-down NMOS transistors 18 are supplied sequentially with the pull-down control signal.

If the fuse element in 23a is blown, the corresponding stage of the shift register always outputs "Hi" status and thus the corresponding 5 word lines are always disabled.

With the present invention, it is possible to provide redundancy to the line buffer as well as the memory cell array as with the above embodiment, even when a sift register is used for a serial address pointer for specifying the address of the line buffer in the field memory.

Figure 16:
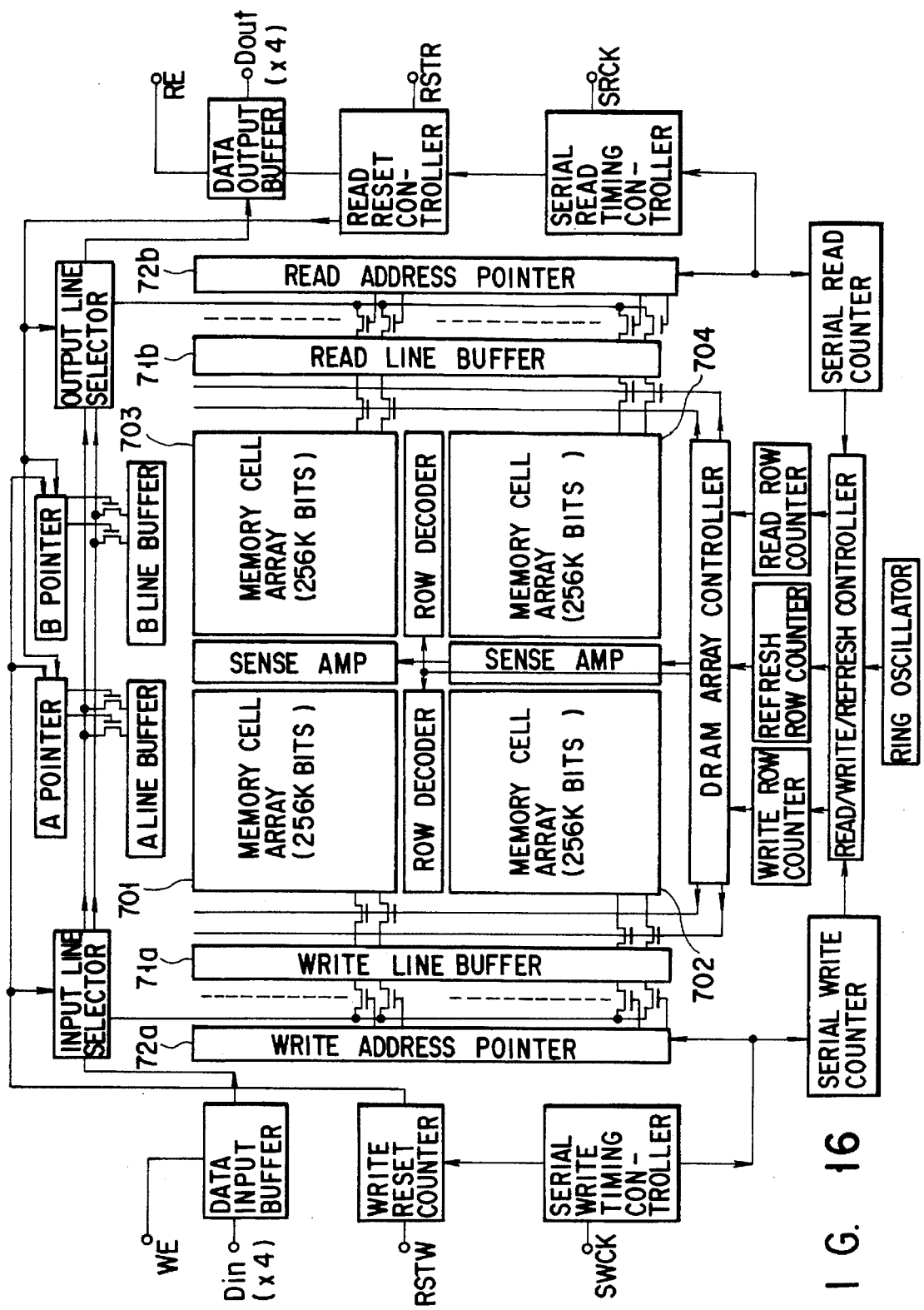
FIG. 16 is a block diagram of a field memory according to a fourth embodiment of the present invention.

FIG. 16 is a block diagram of a field memory according to a fourth embodiment of the present invention.

The field memory comprises a memory cell array divided into four blocks 701 through 704, a write line buffer 71a and a read line buffer 71b for exchanging a column of bit data with the memory cell array, each line buffer having as many buffer circuits as the bits in a single column of the memory cell array, and a write serial address pointer 72a and a read serial address pointer 72b corresponding to the two line buffers 71a and 71b for serially specifying the addresses of the actually used stages of the line buffers 71a and 71b.

In the field memory of the fourth embodiment, the memory cell array is constructed so as to have redundant columns in addition to the necessary rows and columns to obtain a certain memory capacity, or have only the necessary rows and columns to obtain a certain memory capacity. Each of the serial address pointers 72a and 72b is provided with a shift register having as many stages of shift circuits as the number of columns in the memory cell array, a bypass circuit capable of forming a bypass for a given stage of the shift register, and a bypass control circuit that determines whether or not a bypass is to be formed by the bypass circuit, as explained in the above embodiment.

With the present invention, it is possible to provide redundancy to the data register as well as the memory cell array as with the above embodiment, even when a sift register is used for a serial address pointer for specifying the address of the data register at the serial port in a VRAM (video RAM) with a dual port.

FIG. 17 is a block diagram of a dual port VRAM according to a fifth embodiment of the present invention.

This VRAM comprises a memory cell array 90, a data register 92 for exchanging a column of bit data in parallel with the memory cell array via a transfer gate 91 and serially exchanging data with an outside circuit via a serial port, the data register 92 having as many register circuits as the bits in a single column in the memory cell array, and a serial address pointer 93 for specifying the register circuit at the actually used stage of the data register. Numeral 94 indicates a row decoder, 96 a sense amplifier and an I/O gate, 97 a column decoder, 981 a data input buffer, 982 a data output buffer, 991 a serial input buffer, and 992 a serial output buffer.

In the VRAM of the fifth embodiment, the memory cell array 90 is constructed so as to have redundant columns in addition to the necessary rows and columns to obtain a certain memory capacity, or have only the necessary rows and columns to obtain a certain memory capacity. The serial address pointer 93 is provided with a shift register having as many stages of shift circuits as the number of columns in the memory cell array, a bypass circuit capable of forming a bypass for a given stage of the shift register, and a bypass control circuit that determines whether a bypass is to be formed by the bypass circuit, as explained in the above embodiments.

The present invention is not restricted to the embodiments illustrated in detail in this specification, referring to the accompanying drawings. This invention may be practiced or embodied in still other ways without departing from the spirit or essential character thereof.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory comprising:

a memory cell array containing memory cells arranged in a row and column matrix, word lines each connected to the memory cells in the same row, and bit lines each connected to the memory cells in the same column;

a first serial address pointer comprising a first shift register containing a plurality of shift circuits, wherein enabled ones of said plurality of shift circuits in said first shift register determine the rows actually used in the memory cell array;

a second serial address pointer comprising a second shift register containing a plurality of shift circuits, wherein enabled ones of said plurality of shift circuits in said second shift register determine the columns actually used in the memory cell array;

a first bypass circuit provided for the first shift register capable of disabling given ones of said plurality of shift circuits in said first shift register;

a second bypass circuit provided for the second shift register capable of disabling given ones of said plurality of shift circuits in said second shift register;

a first bypass control circuit for determining whether said first bypass circuit disables one or more of said given ones of said plurality of shift circuits in said first shift register; and a second bypass control circuit for determining whether Or not said second bypass circuit disables one or more of said given ones of said plurality of shift circuits in said second shift register.

2. A semiconductor memory according to claim 1, wherein:

said memory cell array contains n (an integer) rows and m (an integer) columns;

said first shift register contains as many stages of shift circuits as 1/k (k: integer) of the number of rows (n) in said memory cell array;

said second shift register contains as many stages of shift circuits as k' (k': integer) of the number of columns (m) in said memory cell array;

said first bypass circuit and said first bypass control circuit are provided for each stage of said first shift register; and said second bypass circuit and said second bypass control circuit are provided for each stage of said second shift register.

3. A semiconductor memory according to claim 2, wherein said memory cell array further contains redundant j (an integer) rows or j' (an integer) columns and said first shift register contains as many stages of shift circuits as 1/k of the number of rows (n +j) in said memory cell array, and said second shift registers contain as many stages of shift circuits as 1/k' of the number of columns (m+j') in said memory cell array.

4. A semiconductor memory according to claim 1, wherein:

stud first shift register contains as many stages of shift circuits as 1/k (k is an integer) of the number of rows in said memory cell array;

stud second shift register contains as many stages of shift circuits as 1/k' (k' is an integer) of the number of columns in said memory cell array;

stud first bypass circuit is provided for each stage of said first shift register;

said second bypass circuit is provided for each stage of said second shift register;

said first bypass control circuit is provided for each stage of said first shift register; and said second bypass control circuit is provided for each stage of said second shift register.

5. A semiconductor memory according to claim 4, wherein given ones of said rows and said columns can be used as redundant rows and columns, and said memory cell array further contains redundant rows and columns.

6. A semiconductor memory according to claim 1, further comprising a row decoder for selectively driving individual word lines in said memory cell array, wherein said second shift register is used to specify a column address in said memory cell array.

7. A semiconductor memory according to claim 6, wherein:

said memory cell array contains n (an integer) rows and m (an integer) columns;

said first shift register contains as many stages of shift circuits as 1/k (k: integer) of the number of rows (n) in said memory cell array, and said second shift register contains as many stages of shift circuits as 1/k' (k': integer) of the number of columns (m) in said memory cell array;

said first bypass circuit and said first bypass control circuit are provided for each stage of said first shift register; and said bypass circuit and said bypass control circuit are provided for each stage of said shift register.

8. A semiconductor memory according to claim 7; wherein said memory cell array further contains redundant j (an integer) rows or j' (an integer) columns, said first shift register contains as many stages of shift circuits as 1/k the number of rows (n +j), and said second shift register contains as many stages of shift circuits as 1/k' the number of columns (m+j') in said memory cell array.

9. A semiconductor memory according to claim 1, further comprising:

a word-line driving circuit for selectively driving the individual word lines in said memory cell array;

a column select circuit for selecting a column in said memory cell array; and a column address-specifying circuit for performing select control of the column select circuit;

wherein said first shift register specifies a row address for selectively driving said word lines.

10. A semiconductor memory according to claim 9, wherein:

said memory cell array contains n (an integer) rows and m (an integer) columns;

said first shift register contains as many stages of shift circuits as 1/k (k: integer) of the number of rows (n) in said memory cell array, and said second shift register contains as many stages of shift circuits as 1/k' (k': integer) of the number of columns (m) in said memory cell array;

said first bypass circuit and said first bypass control circuit are provided for each stage of said first shift register; and said bypass circuit and said bypass control circuit are provided for each stage of said shift register.

11. A semiconductor memory according to claim 10, wherein said memory cell further contains redundant j (an integer) rows or j' (an integer) columns, said first shift register contains as many stages of shift circuits as 1/k the number of rows (n+j) and said second shift register contains as many stages of shift circuits as 1/k' the number of columns (m+j') in said memory cell array.

12. A semiconductor memory according to claim 9, wherein:

said memory cell array is an array of memory cells each capable of storing a plurality of bits of information in bits;

said first shift register contains as many stages of shift circuits as 1/k (k is an integer) of the number of rows in said memory cell array;

said first bypass circuit and said first bypass control circuit are provided for each stage of said first shift register; wherein the output of each stage of said first shift register is used to perform select control of said word-line driving circuits in units of k circuits.

13. A semiconductor memory according to claim 12, wherein said memory cell array contains rows and columns required to obtain a certain memory capacity.

14. A semiconductor memory according to claim 13, wherein given ones of said n rows or said m columns can be used as redundant rows or columns and said memory cell array further contains redundant rows.

15. A semiconductor memory comprising:

a memory cell array containing memory cells arranged in a row and column matrix, word lines each connected to the memory cells in the same row, and bit lines each connected to the memory cells in the same column;

a line buffer which contains as many stages of buffer circuits as the number of memory cells in a column or a row in the memory cell array and which is used to exchange a column or a row of memory cell data with the memory cell array;

a serial address pointer for serially specifying the buffer circuit at an enabled stage of the line buffer, wherein said serial address pointer contains a shift register with multiple stages of shift circuits, a bypass circuit capable of disabling given ones of said multiple stages of shift circuits in said shift register; and a bypass control circuit for determining whether or not said bypass circuit disables one or more of said given ones of said multiple stages of shift circuits.

16. A semiconductor memory according to claim 15, wherein:

said shift register contains as many stages of shift circuits as the number of columns in said memory cell array; and said bypass circuit and said bypass control circuit are provided for each stage of said shift register.

17. A semiconductor memory according to claim 16, wherein given ones of said rows and said columns can be used as redundant rows and columns, and said memory cell array further contains redundant columns or rows.

18. A semiconductor memory with a plurality of ports for video signals comprising:

a memory cell array arranged in rows and columns;

a data register which contains multiple stages of register circuits for exchanging data in parallel with the memory cell array and which serially exchanges data with an external circuit via a serial port;

a serial address pointer for serially specifying the buffer circuit at an enabled stage of the line buffer, wherein said serial address pointer contains a shift register with multiple stages of shift circuits, a bypass circuit capable of disabling given ones of said multiple stages of shift circuits in said shift register; and a bypass control circuit for determining whether or not said bypass circuit disables one or more of said given ones of said multiple stages of shift circuits.

19. A semiconductor memory according to any one of claims 15, and 18, wherein the bypass control circuit provided for each stage of said shift register determines whether or not a bypass is to be formed, when receiving an initialize signal before a normal operation starts.

20. A semiconductor memory according to any one of claims 15 and 18, wherein:

each stage of said shift register contains a first switch gate inserted and connected in series in the input side and the output side of said shift circuit, and supplies an address-specifying signal from the output terminal of the shift circuit;

the bypass circuit provided for each stage of the shift register contains a second switch gate connected in parallel across the input terminal and the output terminal of the shift register stage; and the bypass control circuit provided for each stage of the shift register contains a program element, and supplies a control signal for selectively placing the first switch gate of the corresponding stage and the second switch gate of the corresponding bypass circuit in the on state, depending on whether a program exists for the program element.

21. A semiconductor memory according to claim 20, wherein: the shift register stage is designed not to output a selecting signal when it is bypassed.

22. A semiconductor memory comprising:

a memory cell array containing memory cells connected to word lines and bit lines and arranged in rows and columns, wherein each of the memory cells is capable of storing a plurality of bits of information and includes a plurality of MOS transistors connected in series between first and second nodes wherein said first and second nodes are connected to each another and to one of said bit lines, each of said MOS transistors having a gate connected to one of said word lines;

a plurality of data storage capacitors each connected to a respective corresponding connection node between said series-connected MOS transistors;

a serial address pointer comprising a shift register containing a plurality of shift circuits, wherein said shift register contains as many shift circuits as 1/k (k is an integer) of the number of rows of said memory cell array and enabled ones of said plurality of shift circuits determine the rows and columns actually used in said memory cell array;

a bypass circuit capable of disabling given ones of said plurality of shift circuits in said shift register; and a bypass control circuit for determining whether or not said bypass circuit disables one or more of said given ones of said plurality of shift circuits;

a word-line driving circuit for selectively driving said word lines;

a column select circuit for selecting a column of said memory cell array;

a column address-specifying circuit for performing select control of said column select circuit, wherein said shift register specifies a row address for selectively driving said word lines, said bypass circuit and said bypass control circuit are provided for each shift circuit of said shift register, and the output of each shift circuit of said shift register is used to perform selection control of said word-line driving circuits in units of k circuits.

23. A semiconductor memory comprising:

a memory cell array containing memory cells connected to word lines and bit lines and arranged in rows and columns, wherein given ones of said rows or columns are redundant rows or columns and each of the memory cells is capable of storing a plurality of bits of information and includes a plurality of MOS transistors connected in series between first and second nodes wherein said first and second nodes are connected to each another and to one of said bit lines, each of said MOS transistors having a gate connected to one of said word lines;

a plurality of data storage capacitors each connected to a respective corresponding connection node between said series-connected MOS transistors;

a serial address pointer comprising a shift register containing a plurality of shift circuits, wherein said shift register contains as many shift circuits as 1/k (k is an integer) of the number of rows of said memory cell array and enabled ones of said plurality of shift circuits determine the rows and columns actually used in said memory cell array;

a bypass circuit capable of disabling given ones of said plurality of shift circuits in said shift register; and a bypass control circuit for determining whether or not said bypass circuit disables one or more of said given ones of said plurality of shift circuits;

a word-line driving circuit for selectively driving said word lines;

a column select circuit for selecting a column of said memory cell array;

a column address-specifying circuit for performing select control of said column select circuit, wherein said shift register specifies a row address for selectively driving said word lines, said bypass circuit and said bypass control circuit are provided for each shift circuit of said shift register, and the output of each shift circuit of said shift register is used to perform selection control of said word-line driving circuits in units of k circuits.

24. A semiconductor memory according to claim 18, wherein given ones of said primary columns can be used as redundant columns.

25. A semiconductor memory according to claim 2, wherein given ones of said m rows or said n columns can be used as redundant rows or columns.

26. A semiconductor memory according to claim 7, wherein given ones of said m rows or said n columns can be used as redundant rows or columns.

27. A semiconductor memory according to claim 10, wherein given ones of said m rows or said n columns can be used as redundant rows or columns.

* * * * *